(12) United States Patent
Russell

(10) Patent No.: US 8,354,601 B2
(45) Date of Patent: Jan. 15, 2013

(54) METHOD AND STRUCTURE FOR COAXIAL VIA ROUTING IN PRINTED CIRCUIT BOARDS FOR IMPROVED SIGNAL INTEGRITY

(76) Inventor: James V. Russell, Whitehouse Station, NJ (US)

( * ) Notice: Subject to any disclaimer, the term of this patent is extended or adjusted under 35 U.S.C. 154(b) by 69 days.

(21) Appl. No.: 12/798,217

(22) Filed: Mar. 31, 2010

(65) Prior Publication Data

US 2011/0203842 A1    Aug. 25, 2011

Related U.S. Application Data

(60) Provisional application No. 61/338,918, filed on Feb. 25, 2010.

(51) Int. Cl.
*H05K 1/11* (2006.01)
*H01K 3/10* (2006.01)

(52) U.S. Cl. ......................................... 174/262; 29/852

(58) Field of Classification Search .......... 174/262–266; 29/846–853
See application file for complete search history.

(56) References Cited

U.S. PATENT DOCUMENTS

| | | | | |
|---|---|---|---|---|
| 6,479,764 | B1 * | 11/2002 | Frana et al. | 174/262 |
| 7,091,424 | B2 * | 8/2006 | Oggioni et al. | 174/262 |
| 7,230,318 | B2 * | 6/2007 | Kripesh et al. | 257/621 |
| 7,767,913 | B2 * | 8/2010 | Corisis et al. | 174/262 |
| 2008/0185180 | A1 * | 8/2008 | Cheng et al. | 174/266 |
| 2009/0020326 | A1 * | 1/2009 | Takahashi et al. | 174/262 |

* cited by examiner

*Primary Examiner* — Jeremy Norris
(74) *Attorney, Agent, or Firm* — Richard B Klar, Esq.; Law Office of Richard B Klar

(57) ABSTRACT

A method and a structure for a coaxial via that extend along the entire length of a signal via in a printed circuit board. Signal integrity is improved by providing ground shield for the entire length of the coaxial via. The ground shielding can be implemented by either providing ground cage vias around a signal via and routing a trace to the signal via on a built up layer or by providing a semi circle ground trench through a build up layer to permit a trace access to the signal via.

5 Claims, 4 Drawing Sheets

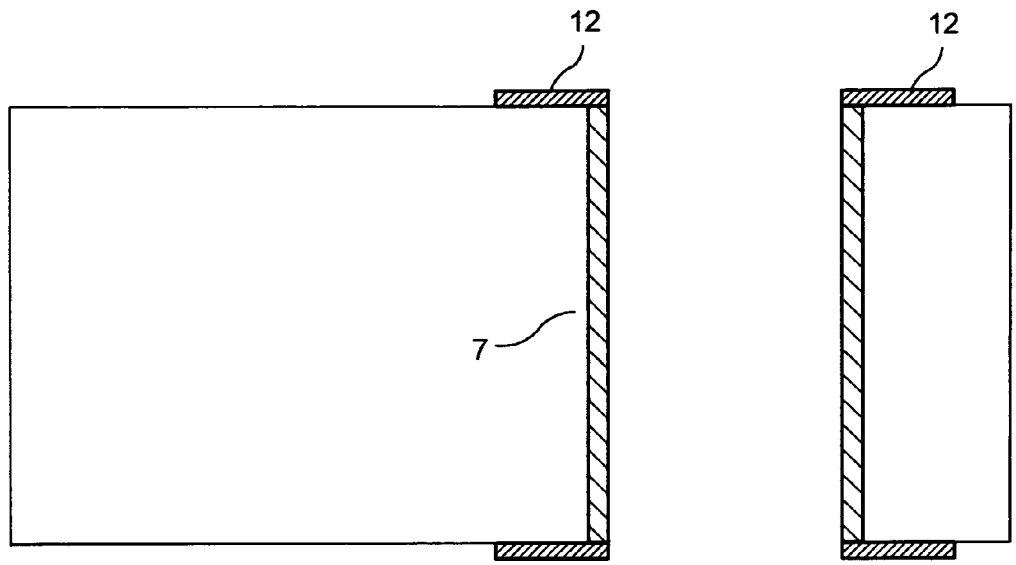
F I G. 2A
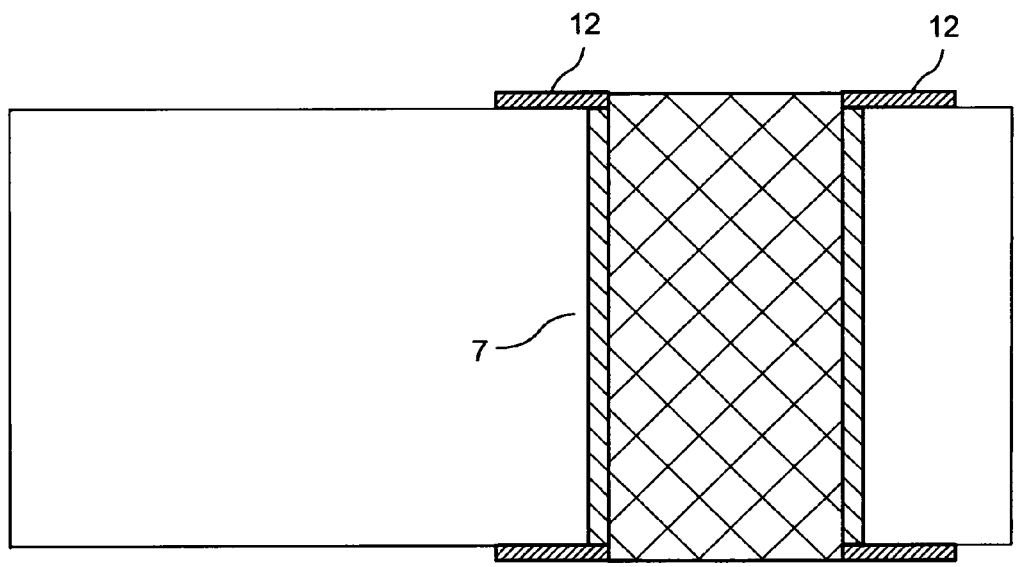
F I G. 2B

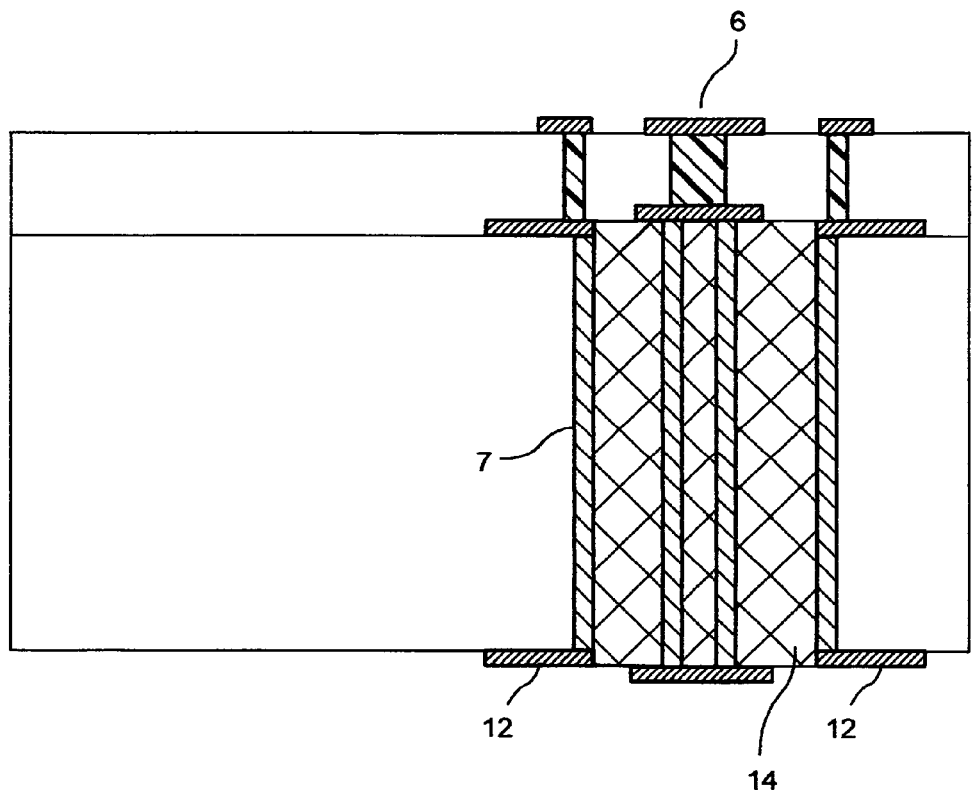
FIG. 2C
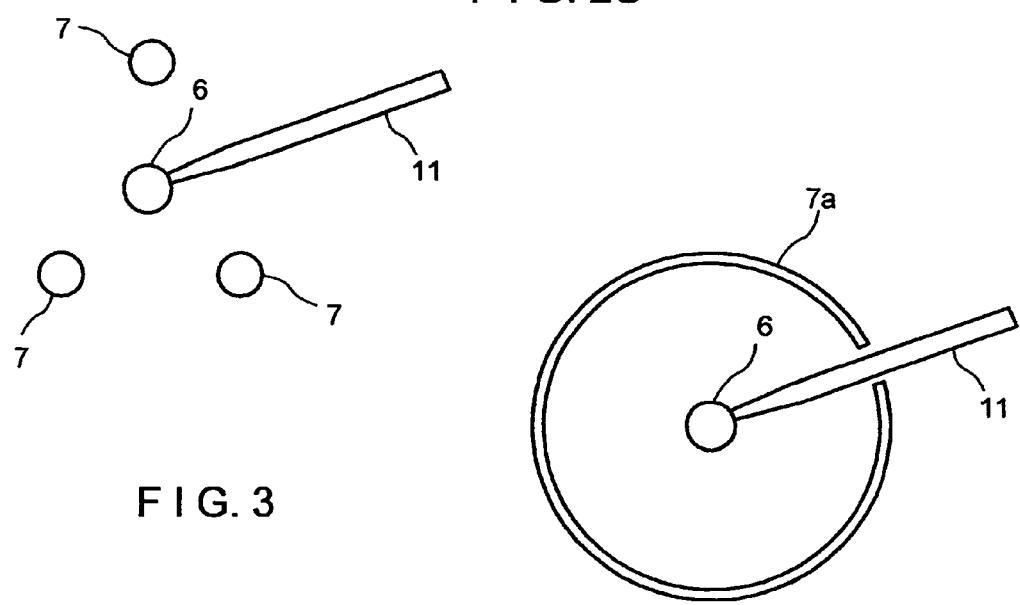
FIG. 3
FIG. 4

METHOD AND STRUCTURE FOR COAXIAL VIA ROUTING IN PRINTED CIRCUIT BOARDS FOR IMPROVED SIGNAL INTEGRITY

RELATED APPLICATIONS

This is a non provisional application of a provisional application Ser. No. 61/338,918 by James V. Russell filed Feb. 25, 2010.

BACKGROUND

1. Field

The present disclosure relates to a method and a structure for coaxial via routing in a printed circuit (pcts) for improved signal integrity. In particular, the present disclosure relates to a method and a structure for coaxial via routing that extends the entire length of the signal via and provides for ground shielding for the entire length of the signal via.

2. The Related Art

U.S. Pat. No. 5,421,083 ("the '083 patent") describes the use coaxial vias for improving electrical performance in printed circuit boards (PCBs). However, while the coaxial via structure in the '083 patent does not provide support for a ground shield for the last length of the wire and the signal integrity suffers as a result. Thus a non-impedance controlled environment exists in the region where trace routing occurs. It would be desirable to provide a method and a structure where a true coaxial via is provided that extends for the entire length of the signal via.

SUMMARY

The present disclosure provides a method and a structure for coaxial via that extends along the entire length of the signal via, improves signal integrity and provides for ground shielding for the entire length of the via. The ground shielding will be provided by either a ground vias cage around the signal via so that a trace can enter the ground vias cage on a built up layer or by providing a ground trench through a built-up layer that permits a trace access to the signal via.

BRIEF DESCRIPTION OF THE DRAWINGS

FIGS. 2A-2C illustrates the steps for making the structure of the present disclosure of FIG. 1 in which:

FIG. 2A is a first step of the manufacturing of the structure of the present disclosure of FIG. 1;

FIG. 2B is a second step of the manufacturing of the structure of the present disclosure of FIG. 1;

FIG. 2C is a third step of the manufacturing of the structure of the present disclosure of FIG. 1;

FIG. 3 is a first embodiment illustrating a top view of ground vias cage for the structure of FIG. 1 and in accordance with the present disclosure;

FIG. 4 is a second embodiment illustrating a top view of ground trench for the structure of the present invention.

DETAILED DESCRIPTION OF THE PREFERRED EMBODIMENTS

Figure 1:
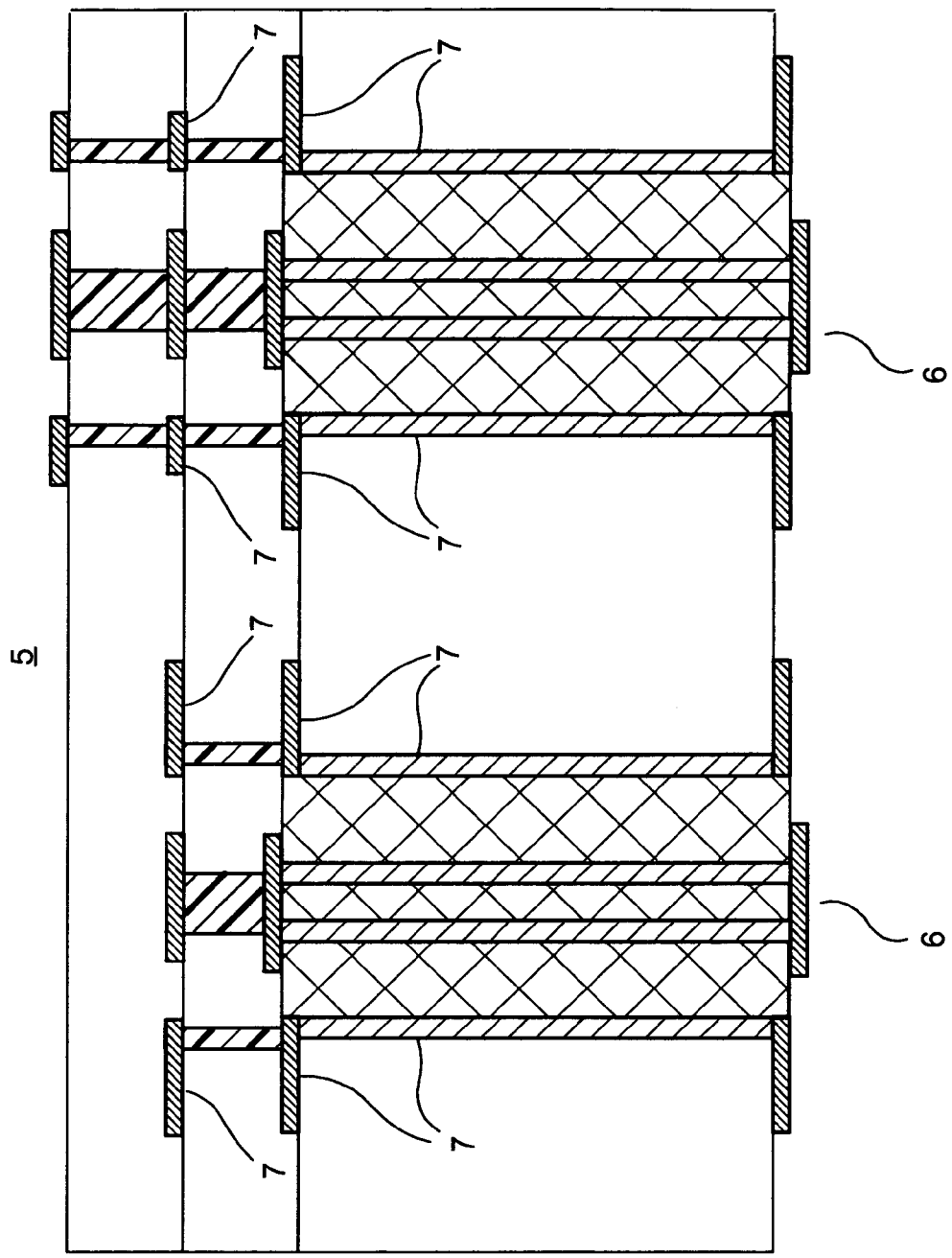
FIG. 1 is a sectional view of the present disclosure.

Referring to the drawings of FIGS. 1-4. FIG. 1 illustrates a sectional view of the structure of the present disclosure. The structure of FIG. 1 is made as described below with reference to the steps shown in FIGS. 2A-2C. The manufacture of coaxial vias for improving the electrical performance of through vias in printed circuit boards has been described in U.S. Pat. No. 5,421,083 as incorporated herein by reference thereto. However, the last length of the via not supported by ground shielding which creates a non-impedance controlled environment exists in the region where trace routing occurs. This causes the signal integrity to suffer. The present disclosure provides for a method and a structure where a true coaxial via that extends for the entire length of the signal via. FIG. 1 shows such a structure 5 for two coaxial vias 6 provided with ground shielding or ground vias 7 or ground trench 7a for each of the coaxial vias 6.

FIGS. 2A-2C describe the method of creating the structure 5 of the present disclosure as shown in FIG. 1. In FIG. 2A the structure 5 is created by providing a two sided or a multi-layered printed circuit board. The non-routed portion of the coaxial via 6 is formed by drilling each of the vias and plating each via to an appropriate diameter to serve as a ground reference for the coaxial via 6. The vias are plated with metallic plating 12 (unlike the vias in U.S. Pat. No. 5,421,083) and are preferably plated with copper (Cu) plating. The appropriate dimensions of the ground via, the signal via and their relationship to each other must be calculated on a case by case basis on the desired impedance value. The next step of the method for forming the structure 5 of the present disclosure is shown in FIG. 2B in which a non conductive paste 14 such as an epoxy is used to fill the void of the ground vias. This paste supports the formation for the signal via.

In FIG. 2C the signal and either ground vias (see embodiment of FIG. 3) or the ground trench (see embodiment of FIG. 4) are plated with a conductive plating or conductive epoxy. This carries the signal and the ground reference up to the routing layers while still preserving the impedance environment. In this way ground shielding is provided at different layers of the structure and brought up with the signal via to the routing layers to maintain signal integrity in accordance with the present disclosure.

FIG. 3 describes the first embodiment for the present disclosure where a cage of ground vias placed around the signal FIG. 3 is a top view illustration. It is understood that some of the ground vias 7 are at different heights for different layers in the structure of the structure 5 of FIG. 1. Thus the ground vias 7 are placed around the signal via extending the ground reference on the layer below and up to the plane (and layer) at which the trace 11 enters the coaxial via 6 and the trace 11 is attached to the coaxial via 6. Thus in this manner the signal via 6 can extend downward from the trace planer layer to attach to the signal via 6 on the layer below. As shown in FIG. 3 the trace lines 11 should be narrowed appropriately as they enter into the signal vias 6 as they are a critical component for reducing return loss due to jitter and reflections.

FIG. 4 is a second embodiment where instead of a cage of ground vias a ground trench 7a in the shape of a semi circle extends around the signal via 6. The trench extends a method and a structure where a true coaxial via is provided that extends for the entire length of the signal via and down to the ground reference of the layer below and up to the plane where the trace 11 enters the coaxial via 6 and the trace attaches to the signal via 6. As with the first embodiment of FIG. 3, this embodiment permits the signal via 6 to extend downward from the trace plane layer to attach to the signal via 6 on the layer below.

Figure 5:
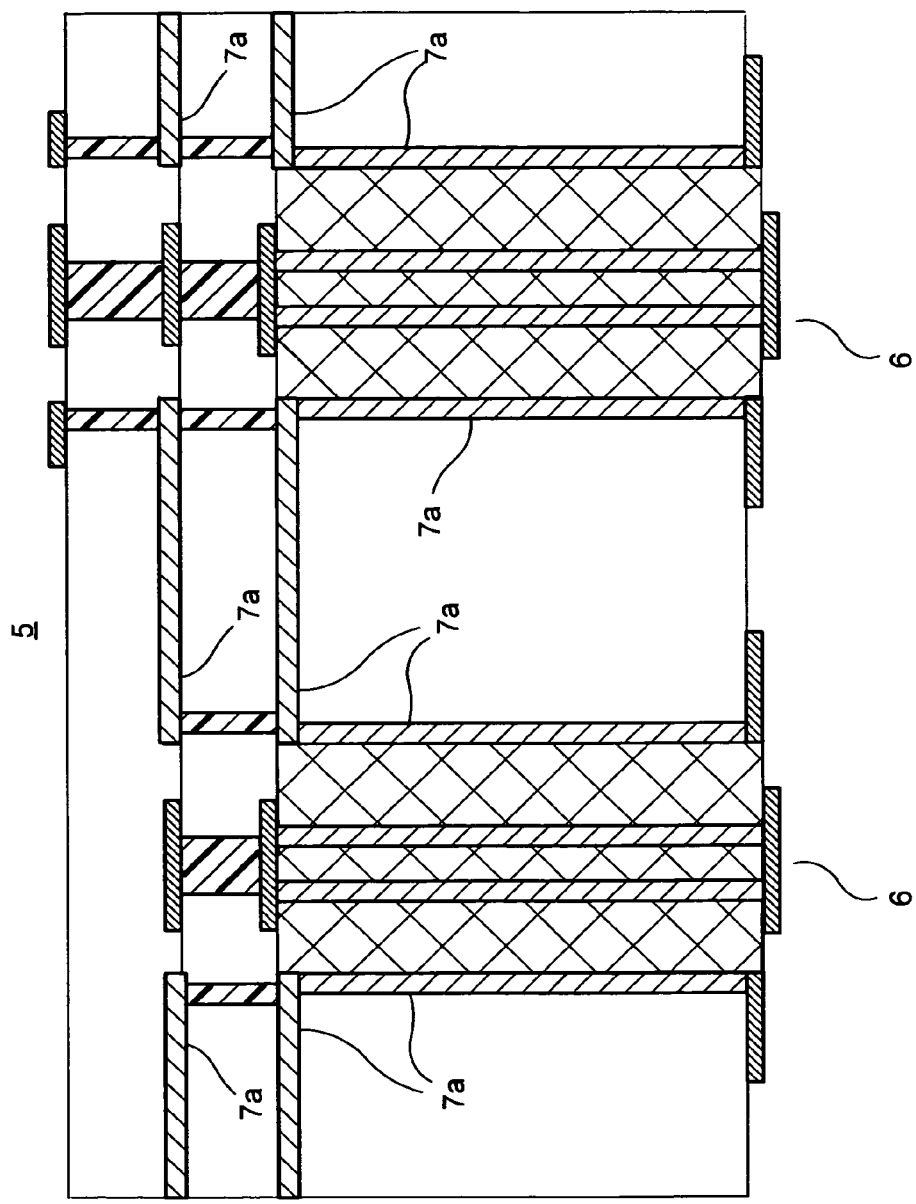
FIG. 5 is a sectional view of the second embodiment of the ground trench for the present invention as shown in FIG. 4.

FIG. 5 is a sectional view of the embodiment shown and described in FIG. 4 wherein a ground trench is formed around a signal via that extends for an entire length of the coaxial signal via and down to a bottom of a ground reference of the layer below of said first structure and up to the plane on said second structure where the trace enters the coaxial signal via and attaches to the signal via to permit the signal via to extend downward from a trace plane layer to attach to the signal via on a layer below.

While certain embodiments have been shown and described, it is distinctly understood that the invention is not limited thereto but may be otherwise embodied within the scope of the appended claims.

What is claimed is:

1. A structure for a coaxial signal via routing in printed circuit board for improving signal integrity, comprising: a structure formed of more than on structures including a first structure and a second structure wherein said second structure is located on top of said first structure and said first and second structures each includes a multi-layered printed circuit board including at least one coaxial via plated; and a ground trench formed around signal via that extends for an entire length of the coaxial signal via and down to a bottom of a ground reference of the layer below of said first structure and UP to the plane on said second structure where the trace enters the coaxial signal via and attaches to the signal via to permit the signal via to extend downward from a trace plane layer to attach to the signal via on a layer below.

2. The structure according to claim 1 wherein said ground trench is plated with metallic plating.

3. The structure according to claim 2 wherein said metallic plating is copper plating.

4. The structure according to claim 1 wherein said vias are filled with conductive paste.

5. A method for forming a structure for a coaxial signal via routing in printed circuit board for improving signal integrity, the steps comprising: forming a structure, a structure formed of more than one structure including a first structure and a second structure wherein said second structure is located on to of said first structure and said first and second structures each includes a multi-layered printed circuit board including at least one coaxial via plated; and forming a ground trench formed around a signal that extends for an entire length of the coaxial signal via and down to a bottom of the ground reference of the layer below of said first structure and UP to the plane on said second structure where the trace enters the coaxial signal via and attaches to the signal via to permit the signal via to extend downward from a trace plane layer to attach to the signal via on a layer below.

* * * * *